United States Patent [19]

Itoh et al.

[11] 3,909,317

[45] Sept. 30, 1975

[54] FORMATION OF ABRUPT JUNCTIONS IN LIQUID PHASE EPITAXY

[75] Inventors: Kunio Itoh; Morio Inoue, both of Takatsuki, Japan

[73] Assignee: Matsushita Electronics Corporation, Kadoma, Japan

[22] Filed: July 30, 1973

[21] Appl. No.: 383,653

[30] Foreign Application Priority Data

July 28, 1972 Japan .............................. 47-76176
July 28, 1972 Japan .............................. 47-76177

[52] U.S. Cl. ................ 148/171; 148/172; 148/173; 252/62.3 GA; 427/87; 118/415

[51] Int. Cl.[2] .......................................... H01L 7/38

[58] Field of Search ........................... 148/171–173; 252/62.3 GA; 117/215; 118/415; 357/17

[56] References Cited

UNITED STATES PATENTS

| | | | |
|---|---|---|---|
| 3,697,336 | 10/1972 | Lamorte | 148/171 |
| 3,747,016 | 7/1973 | Kressel et al. | 148/171 X |
| 3,765,959 | 10/1973 | Unno et al. | 148/171 |
| 3,783,825 | 1/1974 | Kobayashi et al. | 148/172 X |

OTHER PUBLICATIONS

Journal of the Electrochemical Society, Vol. 119, No. 2, Feb. 1972, pp. 277–279.

*Primary Examiner*—G. Ozaki
*Attorney, Agent, or Firm*—Cushman, Darby & Cushman

[57] ABSTRACT

In the manufacturing of a multiple layer semiconductor device, such as semiconductor laser device formed by liquid phase epitaxial growth, the following improvement is offered, that is, after forming a first epitaxial growth layer by making a semiconductor substrate contact a first semiconductor solution, and prior to forming a second epitaxial growth layer by letting said first layer contact with a second semiconductor solution, said first layer is made to contact a third semiconductor solution or liquid metal, whereby the slope of impurity concentration in the vicinity of a junction formed between the first and the second layer can be satisfactorily steepened thereby attaining a good performance.

13 Claims, 9 Drawing Figures

FORMATION OF ABRUPT JUNCTIONS IN LIQUID PHASE EPITAXY

BACKGROUND OF THE INVENTION

This invention relates to an improvement in an apparatus and method to manufacture a semiconductor device having several epitaxial layers on a substrate.

A semiconductor device having known epitaxial growth constitution, for instance, a known semiconductor laser device having a double heterostructure of n-type $Ga_{1-x}Al_xAs$—p-type GaAs—p-type $Ga_{1-x}Al_xAs$, wherein $x$ is an alloy composition, has known advantages, namely, effective confining of light and carrier in the p-type GaAs, as well as close resemblance in lattice constant and thermal expansion coefficient matching of three layers, and hence, comparatively easy continuous laser operation at room temperature. Such multi-layer expitaxial growth semiconductor device is manufactured according to a "sliding" method and apparatus shown in FIG. 1 of the accompanying drawings.

In FIG. 1, which schematically shows a conventional sliding apparatus, a semiconductor substrate 1, for instance, an n-type GaAs substrate, is placed on a recess of a holder 3 installed in a quartz tube 7' provided with an electric heater 8'. The holder 3 is slidingly inserted in a boat 2 of graphite having vertical through holes which contain the under-mentioned semiconductor materials as solutions in liquid phase. The holder 3 is stopped by a stopper 4, and the boat 2 is to be pushed leftwards in FIG. 1 by a pushing rod 5. A thermocouple 6 of a temperature detector is inserted in a horizontal hole 5' of the boat 2 and held under the substrate 1 so as to detect the temperature of the substrate.

One example of the compositions of semiconductor solutions, namely, liquid-phase substances, A, B, C and D in the boat 2 and dopants contained therein is shown in Table 1. The solutions A to D are so prepared as to match a cooling schedule of multi-layer expitaxial growth. In general, effective concentrations are lowered from A to D.

Table 1

| Solution | Components | Type of Conductivity | Dopant |
|---|---|---|---|
| A | Ga 10g; Al 40mg; GaAs 1g | n | Te 500mg |
| B | Ga 10g; GaAs 2g | p | Si 100mg |
| C | Ga 10g; Al 40mg; GaAs 1g | p | Zn 100mg |
| D | Ga 10g; GaAs 1g | p | Zn 400mg |

The process of expitaxial growth on the substrate is as follows:

By heating the boat 2 up to about 900°C. with the heater 8', all the semiconductor solutions A to D are well melted, then, at first, the n-type GaAs substrate is contacted by the solution A, i.e., n-type $Ga_{1-x}Al_xAs$, and next, the temperature is lowered at a slow preset rate of, for instance, 1°C. per minute to epitaxially grow the layer I of n-type $Ga_{1-x}Al_xAs$ on the principal face of the n-type GaAs substrate. The rate of lowering the temperature for epitaxial growth is set equal throughout sequential growth steps. Then, by pushing the boat 2 leftwards with the rod 5, the surface of the layer I formed on the substrate 1 is contacted by the solution B, and subsequently, the temperature is lowered to epitaxially grow the layer II of GaAs. Then, in the similar way, the boat 2 is further pushed leftwards, and the surface of the layer II is contacted by the solution C to epitaxially grow the layer III of p-type GaAlAs. And, finally, in the same way, the boat 2 is further pushed leftwards and the surface of the layer III is contacted by the solution D to epitaxially grow a layer IV. Thus, a conventional semiconductor laser device with a double hetero-structure is manufactured.

According to such conventional method, thickness of the layer of the GaAs, namely, the layer II, which is to become active regions, is likely to vary or scatter, since the layer II has a considerable aluminum composition by an adverse aluminum diffusion from the layer I, as shown in FIG. 2. Accordingly, the threshold current densities for laser operation have a considerable scatter or variation, and, therefore, stable reproducibility of characteristics of the device is not obtainable.

The inventors made many experiments seeking an improved way of eliminating the aforementioned shortcomings. According to the experiments, the insufficient reproducibility of desired characteristics of the device was caused by the fact that in the process of forming a second epitaxial layer upon a first epitaxial layer on a substrate, unnecessary component or components of the first solution remaining on the first layer was mixed into the second layer. Namely, due to such mixing, effective thickness of the second layer becomes scattered or varied, and, therefore, the threshold currents for laser operation scatter considerably.

When the layers I to IV of many of the multi-layer epitaxial growth devices are examined with an X-ray micro-analyzer with regard to the aluminum component in the epitaxial growth direction, the average curve showing the distribution of aluminum component along the growth direction becomes as shown in FIG. 2 of the drawings. Namely, the slope of the curve between the layer I and the layer II is not steep, due to adverse diffusion of the aluminum from the layer I into the layer II. In order to attain good characteristics of the laser operation, such dull fall-down of the curve should be improved to a steeper one. This invention relates to an improvement in steepening the fall-down of the curve between different layers, specially between the active layer and the preceding layer I.

SUMMARY OF THE INVENTION

This invention provides an improved method and apparatus of making multi-layer epitaxial growth having satisfactory reproducibility. This invention is characterized by insertion of an intermediate step of contacting of a specified solution with the previously formed epitaxial layer, between the conventional adjoining steps of epitaxial growth.

BRIEF DESCRIPTION OF THE DRAWINGS

The invention will be further understood from the following detailed description and the accompanying drawings wherein.

DETAILED DESCRIPTION OF THE INVENTION

This invention has a feature that, in the manufacturing of a multi-layer epitaxial growth semiconductor device, the following improvement is offered, that is, after growing a first epitaxial layer by putting a first liquid-phase substance into contact with a semiconductor substrate, and prior to growing a second epitaxial layer by putting a second liquid-phase substance into contact with said first layer, a third liquid-phase substance is put into contact with said first layer, whereby the slope of impurity concentration and aluminum concentration in the vicinity of a junction formed between the first and the second layer can be satisfactorily steepened, thereby attaining a good performance.

According to this invention, after growing the first epitaxial layer, the surface of this growth layer is made to contact the third solution to dissolve and eliminate the unnecessary component of solution remaining on the surface of said growth layer, and then the slope of impurity concentration and aluminum composition in the vicinity of a junction to be formed by the first and second epitaxial layers can be steepened in order to improve the characteristics of the epitaxial-growth device.

Figure 1:
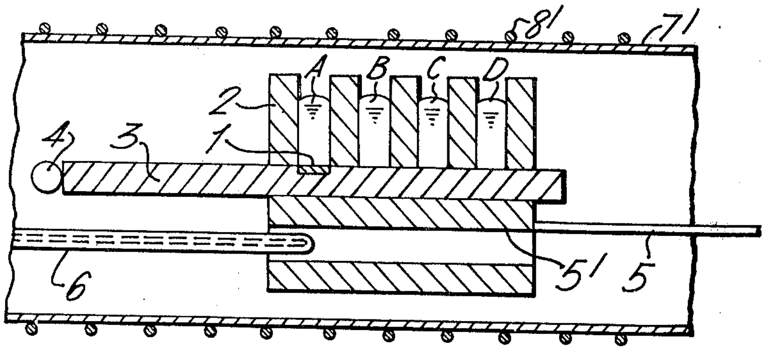
FIG. 1 is a sectional side-view of the conventional sliding-type apparatus of the prior art for making the multi-layer liquid-phase epitaxial growth.
Figure 2:
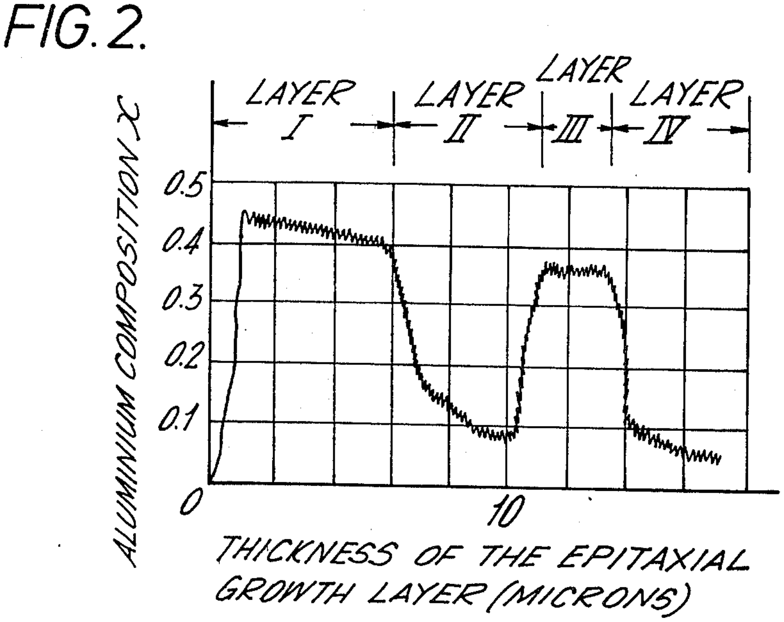
FIG. 2 is a chart showing the distribution of the aluminum composition or concentration of the double hetero epitaxial device manufactured by the apparatus shown in FIG. 1.
Figure 3:
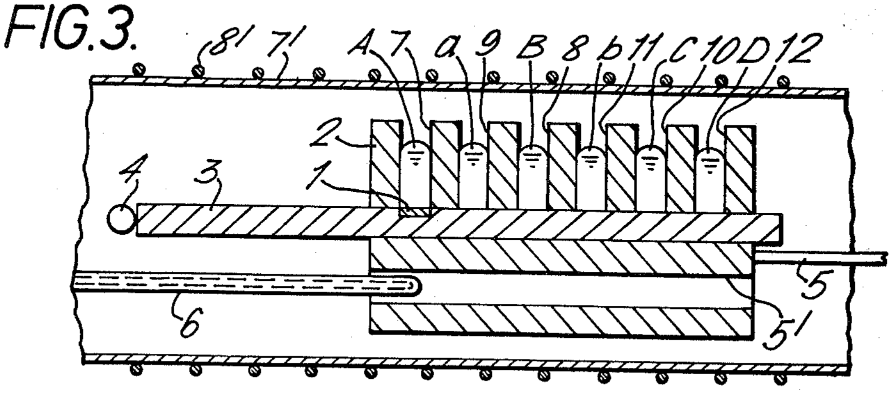
FIG. 3 is a sectional side view of a sliding-type apparatus according to the present invention for making the multi-layer liquid-phase epitaxial growth.

The following description of the invention is made with reference to the embodiment shown in FIG. 3, wherein parts similar to and corresponding to those in FIG. 1 will be indicated by the same reference numerals. In FIG. 3, numeral 7 designates a first solution-receptacle for containing a solution A, and numeral 8 a second solution-receptacle for containing a solution B, numeral 9 a third solution-receptacle (located between the first receptacle 7 and the second receptacle 8) for containing a solution *a*, numeral 10 a fourth solution-receptacle for containing a solution C, numeral 11 a fifth solution-receptacle (located between the second receptacle 8 and the fourth receptacle 10) for containing a solution *b*, and numeral 12 a sixth solution-receptacle for containing a solution D. These receptacles are formed in a row of vertical through-holes or passages in the boat 2.

The solutions, namely liquid-phase substances A to D in the above-mentioned boats are the same compositions as shown heretofore in Table 1, and the compositions of components and dopants of the solutions *a* and *b*, as well as their quantities, are shown in Table 2 hereunder.

Table 2

| Solution | Components | Dopant |
|---|---|---|
| a | Ga 10g; GaAs 1.8g | Nil |
| b | Ga 10g; GaAs 1.8g | Nil |

Next will be explained a procedure of making double heteroepitaxial structure by using the above-mentioned apparatus.

1. A face [100] of the n-type GaAs substrate 1 is secured to the holder 3.
2. The temperature of the boat 2 is raised to 900°C. At this temperature, the GaAs dissolves thoroughly until the solution-receptacles 7 to 12 for the solutions A to D and *a* and *b* reach the thermal equilibrium (requiring about two hours).
3. Then, the receptacle A is put on the substrate 1 so that the solution A is put into contact with the substrate 1 and the temperature is lowered at a constant rate (cooling rate of 1°C. per minute) to reach about 880°C. to grow an epitaxial layer (up to the thickness of about 7 microns) of the n-type $Ga_{1-x}Al_xAs$ (hereinafter called the layer I) (wherein $x = 0.4$). This period of contact is about twenty minutes. The above-mentioned cooling rate also applies to subsequent epitaxial growth steps.
4. When the temperature reaches about 880°C., the cooling is stopped, and while maintaining this temperature, the boat is slid leftward in FIG. 3 to put the solution *a* into contact with the layer I. This step is to prevent a subsequently grown p-type GaAs layer II from containing Al, an unnecessary component likely to remain on the surface of layer I, by dissolving said Al into the solution *a*. The solution *a*, as is shown in Table 2, is a Ga solution substantially saturated with GaAs not doped with impurities. The contacting time of the solution *a* with the epitaxial layer I is preferred to be 1 to 6 seconds, about 3 seconds being the most appropriate according to experimental investigation. During this period, the temperature of the substrate 1 is kept at a constant level or is slightly increased, e.g., for 880° to 880.2°C. Care must be taken not to lower the temperature during this period, since if the boat cools down during this period, a GaAs layer containing Al will grow on the substrate 1. Substantially no layer is formed during this reduced contact period.
5. Subsequently, the boat 2 is slid leftward to put the solution B into contact with the layer I, so as to grow a p-type GaAs layer (hereinafter called the layer II), which is to become an active region, up to the thickness of about 2 microns (requiring about 30 seconds). During this period, too, the solution must be further kept slowly cooling, i.e., to a temperature of about 879.5°C. In the layer II thus grown, almost no Al is contained, and hence, a steep change in the composition between the layers I and II takes place.
6. After growing the layer II, the boat 2 is slid again, while maintaining the boat 2 at the constant temperature of 879.5°C. to put the solution *b* into contact with the layer II. By this process, the solution *b* eliminates the dopant (Si) contained in the solution B, so as to prevent this dopant from being carried into a p-type $Ga_{1-x}Al_xAs$ layer to be epitaxially grown next. This reduced contact requires about 1 second. As shown in Table 2, the solution *b* is of the same composition as the solution *a*.
7. Then, the boat 2 is slid again, while maintaining the boat 2 at the constant temperature of 879.5°C., to put the solution C into contact with the layer II, and the temperature is lowered so as to grow the p-type $Ga_{1-x}Al_xAs$ layer (hereinafter called the layer III) up to the thickness of about 2 microns (requiring about 2 minutes).

8. Finally, the solution D is placed into contact with the layer III and the temperature is lowered to grow a p-type GaAs layer (hereinafter called the layer IV) up to the thickness of 3 microns.

Figure 4:
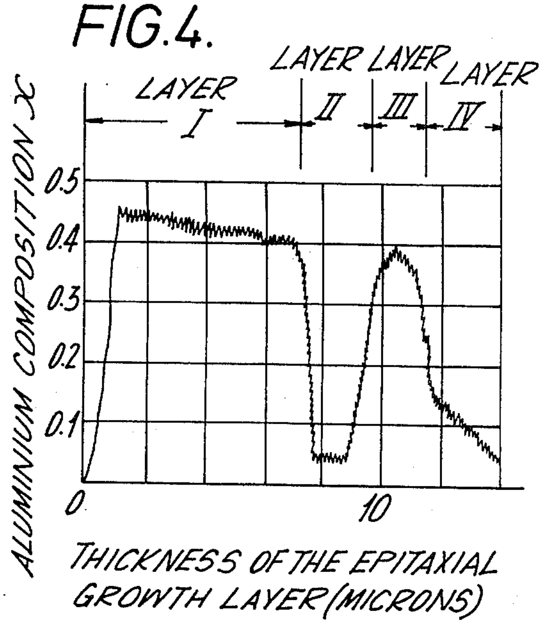
FIG. 4 is a chart showing the distribution of aluminum composition of the double hetero epitaxial device manufactured by the apparatus shown in FIG. 3.
Figure 5:
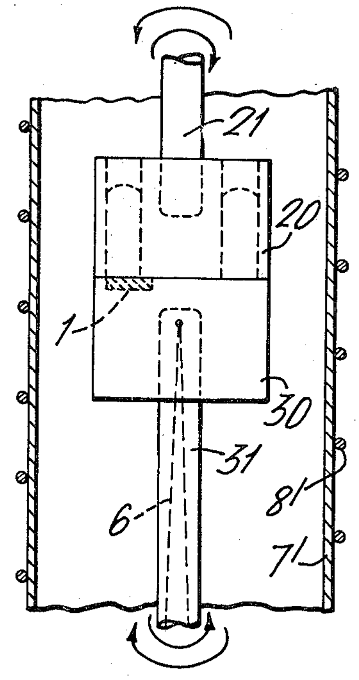
FIG. 5 is a sectional side view of a rotary-type apparatus according to the present invention for making the multiple-layer liquid-phase epitaxial growth.
Figure 6A:
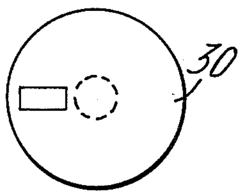
FIG. 6A and FIG. 6B are a plan view and a side view, respectively, of a holder 30 of the apparatus shown in FIG. 5, and FIG. 7A and FIG. 7B are a plan view and a side view, respectively, of a rotary boat 20, of the apparatus shown in FIG. 5.
Figure 7A:
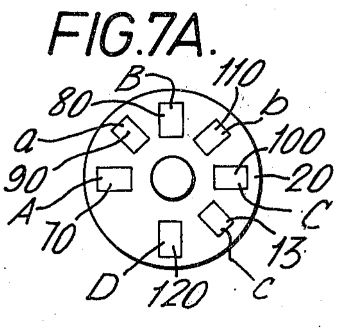
Figure 6B:
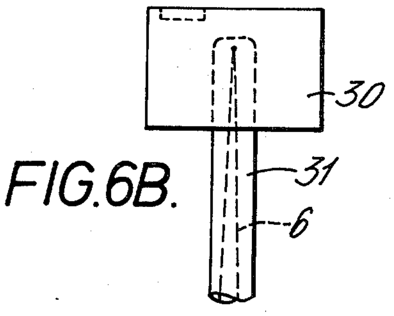
Figure 7B:
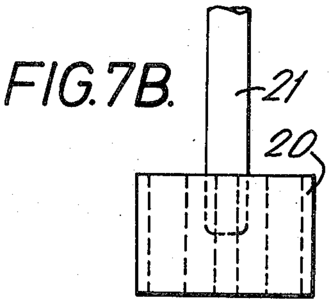

On examining the aluminum composition $x$ in the growth direction by applying an X-ray micro-analyzer on the epitaxial growth layers obtained by the above-mentioned method, a characteristic as shown in FIG. 4 was obtained. It is apparent from the FIG. 4 that in the layer II, which is to become an active region, there is almost no Al mixed therein and that the change in the aluminum composition $x$ on the interface between the layers I and II is extremely steep.

In using the epitaxial growth device made by the above-mentioned apparatus as semiconductor lasers, it was proved that, provided the growth conditions were equal, the threshold current density became almost equal and its degree of scattering was very small. Incidentally, the characteristic graph shown in FIG. 4 exhibits the case where the $Ga_{1-x}Al_xAs$ epitaxial layers are selected to make the aluminum composition $x$ to be 0.4.

Between the solution receptacles 10 and 12, another receptacle can be provided for containing solution such as solution $b$. But even in this case, the characteristic of the epitaxial device was about the same with that of the epitaxial device made by the apparatus of FIG. 3 and not much merit of providing the new solution receptacle was observed. This was because the layer IV is only for obtaining the ohmic contact, and hence, a steep change in the Al composition between the layers III and IV is not specially necessary.

Other embodiments of this invention are shown in FIGS. 5 to 7B, wherein parts corresponding to those shown in FIG. 1 have the same reference numerals. In these figures, numeral 30 designates a holder having a recess on its upper face to fit the substrate 1 therein. Numeral 31 indicates a holder-shaft integrally supporting the holder 30 and numeral 20 a rotary boat having seven vertical through-holes on its circumferential part to form solution receptacles 70, 80, 90, 100 110, 120 and 13. These holes are of the same size and arranged at the equal distance from the axis of the holder-shaft 31. A boat shaft 21 is integrally installed on the rotary boat 20. The above-mentioned constituent parts are set up in the manner shown in FIG. 5. Namely, first, fit the substrate 1 securely into the recess on the holder 30, and then engage or secure the rotary boat 20 on the holder 30 as in FIG. 5. Then, pour the solutions A, B, C, D and $a$, $b$ and $c$, as given by Tables 1, 2 and 3, respectively, into the through-holes or passages on the rotary boat 20, as shown in FIG. 7A. Sectional areas of the holder 30 and rotary boat 20 are preferred to be the same. The composition of the solution $c$, as well as the quantities of each component, are given by Table 3.

Table 3

| Solution | Components | Dopant |
|---|---|---|
| c | Ga 10g; GaAs 1.8g | Nil |

The procedure for making epitaxial growth layers by the abovementioned apparatus is as follows:

1. The n-type GaAs substrate 1 is secured on the holder 30.
2. The temperature of the substrate 1, and the rotary boat 20 are raised to 900°C. While maintaining this temperature, the GaAs is dissolved well until the solution receptacles 70, 80, 90, 100, 110, 120 and 13 for the solutions A to D and $a$ to $c$ attain thermal equilibrium (requiring about 2 hours). It is preferred to keep the holder 30 and the boat 20 rotating during this dissolving operation.
3. Subsequently, both the holder 30 and the boat 20 are stopped quietly. Then, the boat 20 is shifted first to put the solution A into contact with the substrate 1 so as to give an epitaxial growth to the layer I, at slow cooling rate of 1°C. per minute; this cooling rate of 1°C. per minute applies also to subsequent epitaxial growth steps.
4. When the temperature reaches down to 880°C., then the cooling is stopped and while maintaining this temperature and holding the holder 30 quietly, the boat 20 is shifted counter-clockwise to put the solution $a$ into contact with the layer I. By dissolving Al, an unnecessary composition of the solution absorbed on the surface of the layer I, into this solution $a$, Al is prevented from entering a p-type GaAs layer to be grown henceforth. The time the solution $a$ contacts the growth layer I is preferred to be short, and according to experimental investigation, the most appropriate period was about 3 seconds. During this period, the temperature of the substrate 1 must be kept constant or slightly increased, but never lowered. If the temperature goes down during this period, GaAs containing Al will grow on the substrate 1.
5. Subsequently, the boat 20 is shifted to put the solution B into contact with the substrate 1, so as to epitaxially grow the layer II (requiring about 30 seconds). During this period, the solution must, of course, be slowly cooled, i.e., from 880° to 879.5°C. The layer II thus grown contains almost no Al, and hence, the change of aluminum composition $x$ between the layers I and II becomes extremely steep.
6. After the layer II has been grown, the boat 20 is shifted to put the solution $b$ into contact with the layer II while keeping the temperature constant again. By this operation, a dopant (Si) contained in the solution B is eliminated by this solution $b$, preventing the dopant from mixing into a p-type $Ga_{1-x}Al_xAs$ layer to be grown next (requiring about 1 second).
7. Then, the boat 20 is shifted again to put the solution C into contact with the layer II so as to grow the layer III by reducing the temperature, e.g., from 879.5° to 877.5°C.
8. Next, the layer III is made to contact solution $c$ to dissolve therein a solution containing Al brought from the solution C. According to experimental investigation, however, the use of the solution $c$ gave little difference to the characteristics of the epitaxial layer manufactured since a contact layer is subsequently formed.
9. Finally, the solution D is placed into contact with the substrate 1 to grow the layer IV by cooling as heretofore described.

On examining the alloy composition $x$ in the growth direction by applying an X-ray micro-analyzer on the epitaxial layers obtained by the above-mentioned method, a result as shown in FIG. 4 was obtained, the same as in the case of using the apparatus shown in FIG. 3.

By rotating the substrate holder 30 and the rotary boat 20 in the same direction and at the same speed, the speed relationship between the substrate 1 and the boat 20 remains at zero or stationary against each other. So, by such joint rotation, solutions in all solution-receptacles of the boat 20 can be evenly stirred up and thus uniform epitaxial growth layers can be grown.

The above-mentioned epitaxial growth apparatus having a rotary arrangement has the following merits on top of the merits obtainable by that of the slide arrangment:

1. In the case of slide arrangement, the thermal distribution must be unified over the whole length of a number of solutionreceptacles, but in the case of rotary arrangement, the thermal distribution needs to be unified only over a few centimeters, and, therefore, the thermal control is much easier.
2. Whereas the slide arrangement requires the boats to be shifted back and forth, the rotary arrangement requires only a short angle turning.

The above descriptions cover the examples of hetero-epitaxial growths of GaAs and $Ga_{1-x}Al_xAs$. This method can be embodied for hetero-epitaxial growths using crystals of the elements in the IV group, III-V groups and II-IV groups. Also, it can be embodied not only for hetero-epitaxial growths, but also for homo-epitaxial growths.

Homo-epitaxial growth layers are made by the following method: First, the layer I of n-type GaAs is grown by applying the solution E shown in the following Table 4 on the n-type GaAs substrate. After the n-type layer I has been formed, its surface is washed with the solution *a* or *b* shown in Table 2 so as to eliminate unnecessary Al, and then, a p-type second layer similar to the layer IV described in the above-mentioned mode of operation is formed. Then, the layer II of p-type GaAs is grown on this layer I by using the solution D shown in Table 1.

Table 4

| Solution | Components | Dopant |
|---|---|---|
| E | Ga 10g; GaAs 2g | Te 500mg |

In the aforementioned Tables 2 and 3, the composition of GaAs is selected to substantially saturate the solutions. If the concentration of GaAs is too much, it results in unnecessarily growing a layer same as that previously grown. If the concentration of GaAs is too weak, the previously grown layer will be etched.

While the novel principles of the invention have been described, it will be understood that various omissions, modifications and changes in these principles may be made by one skilled in the art without departing from the spirit and scope of the invention.

What is claimed is:

1. In a method for manufacturing multiple layers by liquid phase epitaxial growth comprising the steps of contacting a semiconductor substrate with at least two different semiconductor solutions for subsequent epitaxial growth on said substrate, the improvement which comprises:

after forming an epitaxial growth layer on said substrate by contacting it with one of said solutions and prior to forming a subsequent epitaxial growth layer, another solution, which is substantially saturated with solute contained in said solution which has been contacted with said substrate and which dissolves the unnecessary component or components therein and removes them from the former layer, contacting said former epitaxial growth layer, wherein the temperature of said another solution is held constant or raised slightly during the contacting with said another solution.

2. A method of claim 1, wherein the principal face of said semiconductor substrate comprises a component of the III–V group, and said solutions, respectively, comprise semiconductor solutes of the III–V group.

3. A method of claim 2, wherein the principal face of said semiconductor substrate is of GaAs, both of said at least two different solutions contained Ga, Al and GaAs, and said another solution which is a saturated solution containing Ga and GaAs but substantially excludes Al.

4. A method of claim 3, wherein the temperature of said another solution is controlled to be not lowered during the contacting with said another solution.

5. A method of claim 3, wherein the temperature of said another solution is held constant or raised slightly during the contacting with said another substance.

6. A method of claim 2, wherein the temperature of said another solution is controlled to be not lowered during the contacting with said another solution.

7. A method of claim 2, wherein the principal face of said semiconductor substrate is of GaAs, both of said at least two different substances contain Ga, Al and GaAs, and said another substance contains Ga and GaAs but substantially excludes Al.

8. A method of claim 2, wherein the temperature of said another solution is held constant or raised slightly during the contacting with said another substance.

9. A method of claim 1, wherein the temperature of said another solution is controlled to be not lowered during the contacting with said another solution.

10. A method of claim 1, wherein the principal face of said semiconductor substrate comprises a component of the III–V group, and said solutions respectively, comprise semiconductor solutes of the III–V group.

11. A method of claim 1, wherein the temperature of said another solution is held constant or raises slightly during the contacting with said another substance.

12. In a method for manufacturing a semiconductor device of multiple layers epitaxially grown by liquid phase epitaxial growth wherein a semiconductor substrate is contacted by at least two different semiconductor solutions for sequential epitaxial growth of a layer from each of said solutions, the improvement which comprises, after forming of a first epitaxial growth layer, and prior to forming a second epitaxial growth layer, contacting said first epitaxial growth layer with a semiconductor solution that prevents at least one component in the first epitaxial growth layer from diffusing into the second epitaxial growth layer during formation of said second epitaxial growth layer, whereby a steep slope of concentration of said one component is produced at the junction between the first and second epitaxial grown layers.

13. A method for manufacturing a semiconductor of multiple layers by liquid-phase epitaxial growth comprising the steps of contacting a semiconductor substrate with at least two different liquid-phase substances for subsequent epitaxial growth on said substrate, characterized in that:

after forming an epitaxial growth layer with a first of said solutions and prior to forming a subsequent epitaxial growth layer, another solution on which is saturated with a solute of said first solution which dissolves the unnecessary component or components therein and removes them from the former layer, contacts said former epitaxial growth layer.

* * * * *